United States Patent
Chiu et al.

(10) Patent No.: US 9,064,836 B1
(45) Date of Patent: Jun. 23, 2015

(54) EXTRINSIC GETTERING ON SEMICONDUCTOR DEVICES

(75) Inventors: Chin-Tien Chiu, Taichung (TW); Shrikar Bhagath, San Jose, CA (US); Yuang Zhang, Shanghai (CN); Lu Zhong, Shanghai (CN); Kaiyou Qian, Shanghai (CN)

(73) Assignee: SanDisk Semiconductor (Shanghai) Co., Ltd., Shanghai (CN)

( * ) Notice: Subject to any disclaimer, the term of this patent is extended or adjusted under 35 U.S.C. 154(b) by 476 days.

(21) Appl. No.: 12/852,643

(22) Filed: Aug. 9, 2010

(51) Int. Cl.
*H01L 29/34* (2006.01)
*H01L 21/02* (2006.01)

(52) U.S. Cl.
CPC .......... *H01L 29/34* (2013.01); *H01L 21/02024* (2013.01)

(58) Field of Classification Search
CPC ............ H01L 22/32; H01L 2223/5446; H01L 31/0236; H01L 21/02013; H01L 21/02024; H01L 21/30625; H01L 29/30; H01L 29/34; H10L 22/34
USPC ................... 257/E21.483, E21.484, E29.106, 257/E29.108, E31.13, 730; 438/143, 310, 438/402, 471, 473, 474, 475, 58
See application file for complete search history.

(56) References Cited

U.S. PATENT DOCUMENTS

| | | | |
|---|---|---|---|
| 5,627,081 A | 5/1997 | Tsuo et al. | |
| 5,810,648 A | 9/1998 | Jiang et al. | |
| 5,882,539 A * | 3/1999 | Hasegawa et al. | 216/88 |
| 6,184,064 B1 * | 2/2001 | Jiang et al. | 438/113 |
| 6,261,919 B1 * | 7/2001 | Omizo | 438/401 |
| 6,268,237 B1 * | 7/2001 | Flesher et al. | 438/106 |
| 6,488,767 B1 * | 12/2002 | Xu et al. | 117/2 |
| 6,576,990 B2 * | 6/2003 | Flesher et al. | 257/679 |
| 6,940,181 B2 * | 9/2005 | Derderian et al. | 257/787 |
| 7,064,069 B2 * | 6/2006 | Draney et al. | 438/690 |
| 7,253,026 B2 * | 8/2007 | Ahn et al. | 438/111 |
| 7,374,473 B2 | 5/2008 | Kumasaka et al. | |
| 7,427,811 B2 * | 9/2008 | Derderian et al. | 257/783 |
| 7,447,037 B2 * | 11/2008 | Hiew et al. | 361/737 |
| 7,466,556 B2 * | 12/2008 | Hiew et al. | 361/737 |
| 7,535,719 B2 * | 5/2009 | Hiew et al. | 361/737 |
| 7,649,256 B2 * | 1/2010 | Kujirai et al. | 257/730 |
| 7,700,488 B2 * | 4/2010 | Codding et al. | 438/690 |
| 7,732,303 B2 * | 6/2010 | Codding et al. | 438/473 |
| 7,887,396 B2 * | 2/2011 | Laursen et al. | 451/540 |
| 7,892,072 B2 * | 2/2011 | Lee et al. | 451/41 |
| 7,956,356 B2 * | 6/2011 | Tanikella et al. | 257/43 |
| 8,222,118 B2 * | 7/2012 | Dydyk et al. | 438/459 |
| 8,376,810 B2 | 2/2013 | Schwandner | 451/41 |
| 8,388,411 B2 * | 3/2013 | Schwandner | 451/36 |
| 8,455,879 B2 * | 6/2013 | Tanikella et al. | 257/76 |
| 2001/0031511 A1 * | 10/2001 | Flesher et al. | 438/106 |

(Continued)

OTHER PUBLICATIONS

Sato, et al. "Copper Polishing with a Polishing Pad Incorporating Abrasive Grains and a Chelating Resin", Apr. 2009, Precision Engineering, pp. 167-174, vol. 33, Issue 2, Elsevier Inc.

*Primary Examiner* — Earl Taylor
(74) *Attorney, Agent, or Firm* — Vierra Magen Marcus LLP

(57) ABSTRACT

A semiconductor wafer, die and semiconductor package formed therefrom are disclosed, where the inactive surface of the wafer has an extrinsic gettering pattern formed from a texturing process. In examples, the texturing process follows a polishing process that removes stress concentration point from the inactive surface of the wafer.

11 Claims, 6 Drawing Sheets

(56) References Cited

U.S. PATENT DOCUMENTS

| | | | |
|---|---|---|---|
| 2002/0037650 A1* | 3/2002 | Kishimoto | 438/692 |
| 2002/0052116 A1* | 5/2002 | Vepa et al. | 438/692 |
| 2002/0121680 A1* | 9/2002 | Ahn et al. | 257/666 |
| 2002/0185054 A1* | 12/2002 | Xu et al. | 117/2 |
| 2005/0085008 A1* | 4/2005 | Derderian et al. | 438/106 |
| 2006/0006528 A1* | 1/2006 | Kujirai et al. | 257/730 |
| 2006/0110858 A1* | 5/2006 | Ahn et al. | 438/123 |
| 2006/0237822 A1* | 10/2006 | Derderian et al. | 257/643 |
| 2007/0037321 A1* | 2/2007 | Higashino et al. | 438/109 |
| 2007/0293088 A1* | 12/2007 | Hiew et al. | 439/610 |
| 2008/0006927 A1* | 1/2008 | Hiew et al. | 257/691 |
| 2008/0020641 A1* | 1/2008 | Hiew et al. | 439/607 |
| 2008/0094807 A1* | 4/2008 | Hiew et al. | 361/737 |
| 2008/0145968 A1* | 6/2008 | Hiew et al. | 438/107 |
| 2008/0164578 A1* | 7/2008 | Tanikella et al. | 257/628 |
| 2008/0166951 A1* | 7/2008 | Tanikella et al. | 451/37 |
| 2008/0171439 A1* | 7/2008 | Codding et al. | 438/692 |
| 2008/0195817 A1* | 8/2008 | Hiew et al. | 711/115 |
| 2008/0235939 A1* | 10/2008 | Hiew et al. | 29/831 |
| 2008/0286990 A1* | 11/2008 | Hiew et al. | 439/55 |
| 2009/0068933 A1* | 3/2009 | Lee et al. | 451/287 |
| 2009/0166887 A1* | 7/2009 | Upadhyayula et al. | 257/777 |
| 2009/0191667 A1* | 7/2009 | Higashino et al. | 438/109 |
| 2009/0224370 A1* | 9/2009 | Slutz | 257/618 |
| 2010/0019397 A1* | 1/2010 | Youn et al. | 257/784 |
| 2010/0110647 A1* | 5/2010 | Hiew et al. | 361/752 |
| 2010/0264566 A1* | 10/2010 | Moore et al. | 264/401 |
| 2010/0308442 A1* | 12/2010 | Naka et al. | 257/620 |
| 2011/0101546 A1* | 5/2011 | Lee et al. | 257/797 |
| 2012/0289126 A1* | 11/2012 | Tanikella et al. | 451/41 |

* cited by examiner

EXTRINSIC GETTERING ON SEMICONDUCTOR DEVICES

BACKGROUND OF THE INVENTION

1. Field

The present technology relates to semiconductor devices.

2. Description of Related Art

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While a wide variety of packaging configurations are known, flash memory storage cards may in general be fabricated from so-called 3-D semiconductor devices, including for example a system-in-a-package (SiP) or a multichip module (MCM), where a plurality of die are mounted on a substrate in a stacked configuration. Edge views of conventional 3-D semiconductor packages 20 (without molding compound) are shown in prior art FIGS. 1 and 2. Typical packages include a plurality of semiconductor die 22 mounted to a substrate 26. In the examples shown, the die stack has four die, 22a, 22b, 22c and 22d. Further examples have more or less die in the stack. Although not shown in FIGS. 1 and 2, the semiconductor die 22 are formed with die bond pads on an upper surface of the die. Substrate 26 may be formed of an electrically insulating core sandwiched between upper and lower conductive layers. The upper and/or lower conductive layers may be etched to form conductance patterns including electrical leads and contact pads. Wire bonds 30 are soldered between the die bond pads of the semiconductor die 22 and the contact pads of the substrate 26 to electrically couple the semiconductor die to the substrate. The electrical leads on the substrate in turn provide an electrical path between the die and a host device. Once electrical connections between the die and substrate are made, the assembly is then typically encased in a molding compound to provide a protective package.

Semiconductor die are batch processed from silicon wafers. A wafer includes an active surface, in which the integrated circuits of the semiconductor die are formed, and an inactive surface, or backside, opposite the active surface. During fabrication, impurities are introduced into semiconductor wafers which can degrade the performance of the finished semiconductor die and reduce yield of acceptable devices. At elevated temperatures, these impurities become more mobile and tend to gravitate toward stress concentration areas in a wafer where they become trapped. It is therefore known to create stress concentration areas away from the active surface of the wafer, in a process known as gettering.

There are two broad categories of gettering: intrinsic gettering and extrinsic gettering. Intrinsic gettering is achieved by providing gettering sites within the interior of the wafer, away from the active surface. Some commonly known approaches include providing oxygen precipitates within the bulk silicon that serve as gettering sites. Extrinsic gettering is a process whereby dislocations and crystal disorders are created on the inactive surface of the wafer. These intentionally created disorders result in stress concentration areas which act as effective traps for the impurities to keep them away from the active surface of the semiconductor wafer.

One problem with known extrinsic gettering processes is that the creation of dislocations and stress concentrations is poorly controlled. As the thicknesses of semiconductor wafers are getting smaller and smaller, stress concentrations formed by conventional extrinsic gettering processes can result in a weakening of the wafer to the point of cracking or other mechanical failure of the wafer. Coming at the end of the wafer fabrication process, such failure has a high cost and can result in a significant reduction in yield.

DETAILED DESCRIPTION

Embodiments will now be described with reference to FIGS. 3 through 11, which relate to extrinsic gettering within a semiconductor wafer and a semiconductor package formed with die therefrom. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top," "bottom," "upper," "lower," "vertical" and/or "horizontal" as may be used herein are for convenience and illustrative purposes only, and are not meant to limit the description of the invention inasmuch as the referenced item can be exchanged in position.

Figure 1:
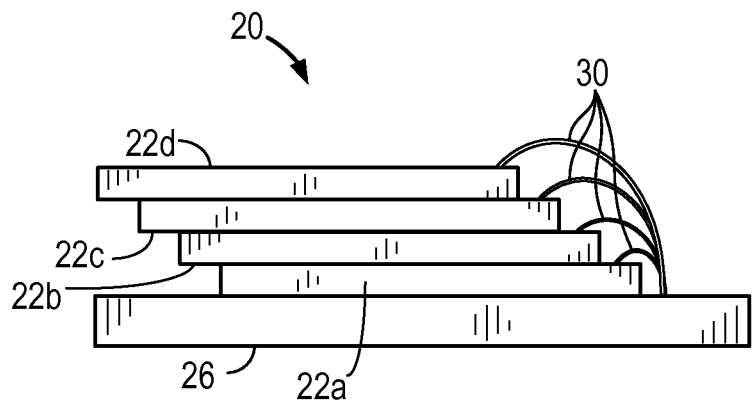
FIG. 1 is a prior art edge view of a conventional semiconductor device including semiconductor die stacked in an offset relation.
Figure 2:
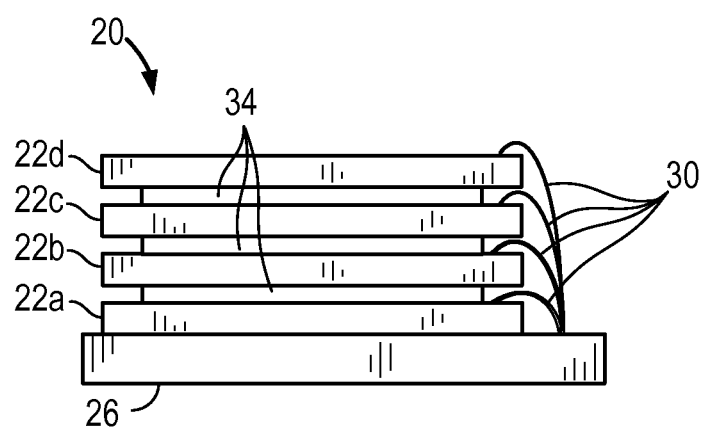
FIG. 2 is a prior art edge view of a conventional semiconductor device including semiconductor die stacked in an aligned relation and separated by spacer layers.
Figure 3:
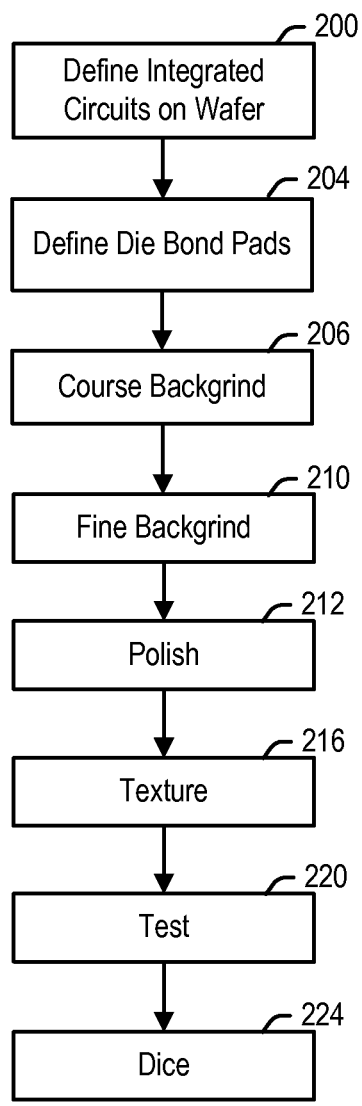
FIG. 3 is a flowchart for forming semiconductor die on a wafer according to embodiments of the present system.
Figure 4:
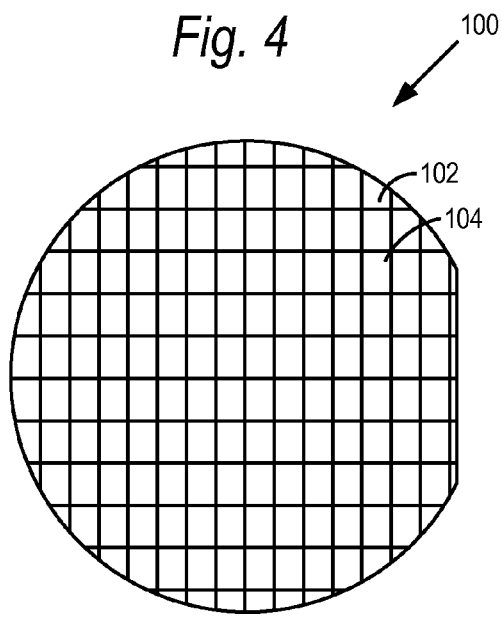
FIG. 4 is a top view of a semiconductor wafer according to embodiments of the present technology.
Figure 5:
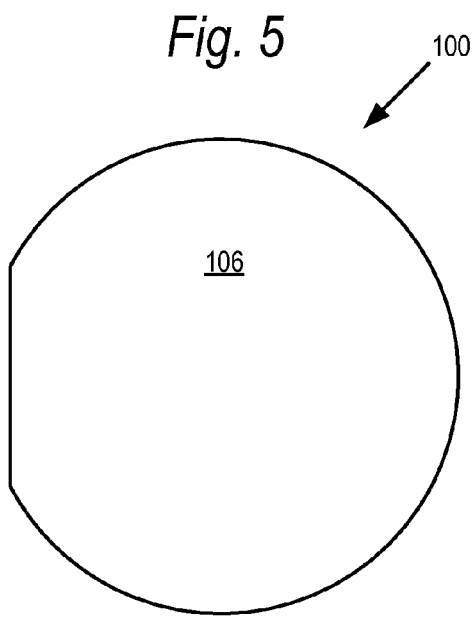
FIG. 5 is a bottom view of a semiconductor wafer according to embodiments of the present technology.
Figure 6:
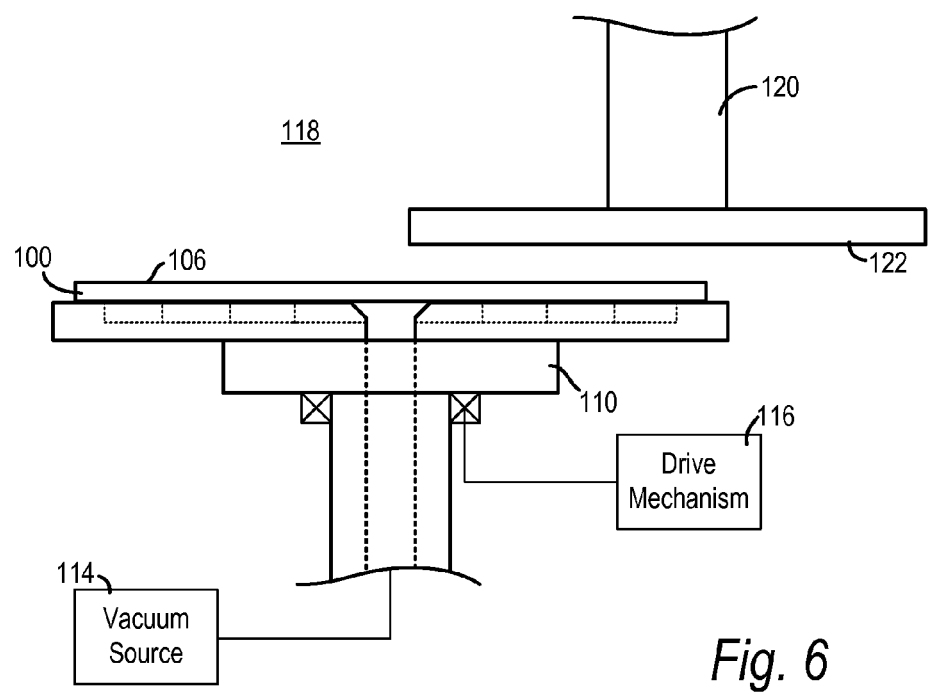
FIG. 6 is a side view of a semiconductor wafer on a chuck during a grinding process according to embodiments of the present technology.

A process for forming semiconductor wafers in accordance with the present technology will now be described with reference to the flowchart of FIG. 3, and the various views of FIGS. 4 through 10. FIG. 4 shows a semiconductor wafer 100, and in particular an active surface 102 on which a plurality of semiconductor die 104 (one of which is labeled in FIG. 4) are batch processed. FIG. 5 shows an inactive surface 106, opposite the active surface 102.

The integrated circuit components of semiconductor die 104 may be formed on the active surface 102 of wafer 100 in step 200 by known processes such as film deposition, photolithography, patterning, and diffusion of impurities. Die bond pads (not shown) may then be formed in respective die in step 204 by known processes including but not limited to plating, evaporation, screen printing, or various deposition processes. As is known, the bond pads are used to electrically couple the semiconductor die 104 to other semiconductor die, or to a printed circuit board, leadframe or other substrate as explained hereinafter.

In a step 206, a coarse backgrind process may be performed on the inactive surface 106 of wafer 100. In particular, a tape may be applied to the active surface 102 to protect the defined semiconductor die 104. Thereafter, the taped active surface 102 may be placed in contact with a chuck 110 shown in FIG. 6. The wafer 100 may be clamped to the chuck 110 by various known methods including by a vacuum communicated to the surface of the chuck from a vacuum source 114. The chuck 110 may be rotated by a drive mechanism 116.

The chuck 110 and wafer 100 may then be positioned within a rough backgrind station 118 including a rotating backgrind wheel 120. The wheel 120 may be lowered into contact with the inactive surface 106 of the wafer as the wafer is rotating on the chuck 110 to grind down the backside of the wafer to a desired thickness. Backgrind wheel 120 may have a coarse surface 122 covered for example with a 320 grit diamond grinding disk. The coarse backgrind step 206 may thin the wafer 100 from an initial thickness of 760 µm down to 82 µm. It is understood that starting and ending thicknesses of the wafer 100 for the coarse backgrind step 206 may be larger or smaller than these values in further embodiments. It is further understood that the coarse backgrind process of step 206 may be performed with other instruments, or with other coarse grinding materials, in further embodiments.

In step 210, a fine backgrind process may be performed on the inactive surface 106. The chuck 110 and wafer 100 may be moved to the fine backgrind station including a rotating backgrind wheel as in wheel 120 shown in FIG. 6. Alternatively, the fine backgrind process may be performed in the same station as the coarse backgrind process. The backgrind wheel of step 210 may smooth out some of the irregularities left by the coarse backgrind process. In embodiments, the backgrind wheel of step 210 may include for example a 2000 grit diamond grinding disk. The fine backgrind step 210 may thin the wafer 100 from an initial thickness of 82 µm down to 52 µm. It is understood that starting and ending thicknesses of the wafer 100 for the fine backgrind step 210 may be larger or smaller than these values in further embodiments. It is further understood that the fine backgrind process of step 210 may be performed with other instruments, or with other fine grinding materials, in further embodiments.

In conventional systems, the surface of the wafer may be left as is after the fine backgrind process of step 210 in order to provide extrinsic gettering sites to capture impurities within the wafer 100. However, the inactive surface 106 of the wafer after step 210 may have poorly controlled stress concentrations, some of which may be undesirably large. These large stress concentrations may mechanically weaken the wafer 100 which may lead to wafer cracking in later assembly processes.

Figure 7:
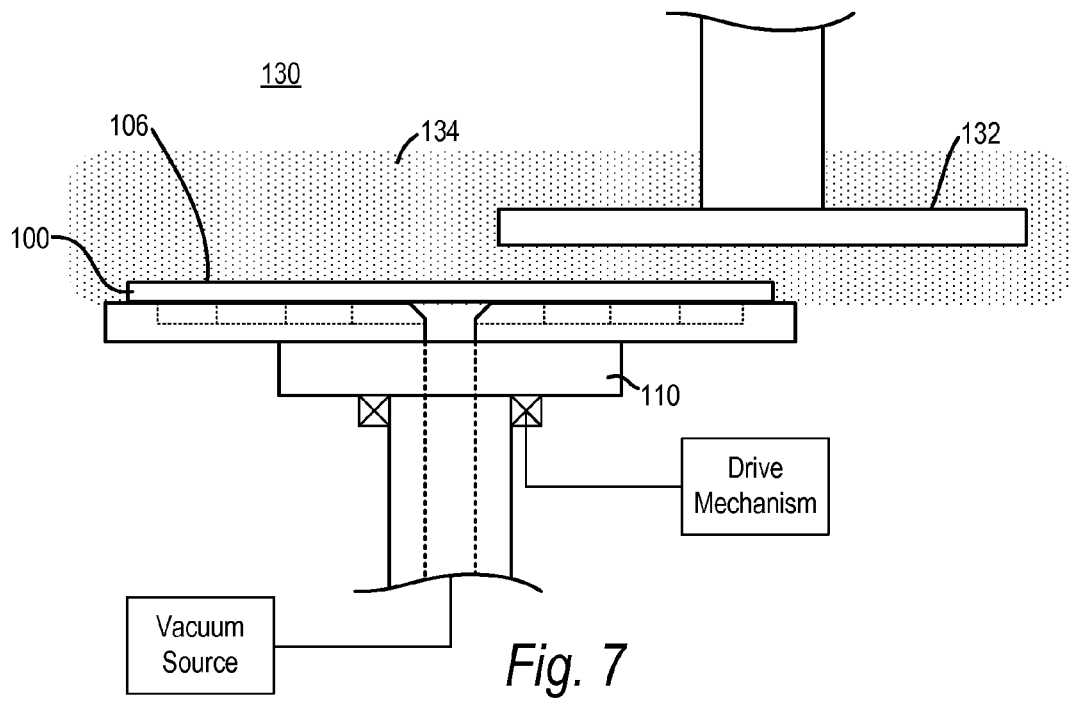
FIG. 7 is a side view of a semiconductor wafer on a chuck during a polishing process according to embodiments of the present technology.

Therefore, the present technology further includes a chemical mechanical polish (CMP) step 212 for polishing the inactive surface 106 to remove the stress concentration points left after the fine backgrind process of step 210. FIG. 7 shows a view of portions of a processing station 130 for performing the CMP step 212. The chuck 110 with wafer 100 still mounted thereon is transferred into the station 130. A polishing wheel 132 polishes the inactive surface 106 with the aid of a slurry 134, which is introduced into the station as the chuck 110 and polishing wheel 132 rotate in contact with each other.

The polishing wheel 132 may have a polishing pad, which in embodiments may for example be or include a polyurethane cloth. Other known materials may be used as the polishing surface on polishing wheel 132. The slurry 134 polishes the inactive surface 106 under pressure from the polishing wheel 132. In embodiments, the slurry 134 may be comprised of a silica (silicon dioxide) slurry, with silica particle sizes of 0.05 µm to 0.1 µm. Other types of slurry may be used, and other particle sizes (both larger and smaller) may be used, in further embodiments. Upon completion of the polishing step 212, the inactive surface 106 may have a mirror finish, with the stress concentration points having been removed from the inactive surface 106. It is understood that the polishing step 212 may be performed by other methods and by other mechanisms in further embodiments.

Figure 8:
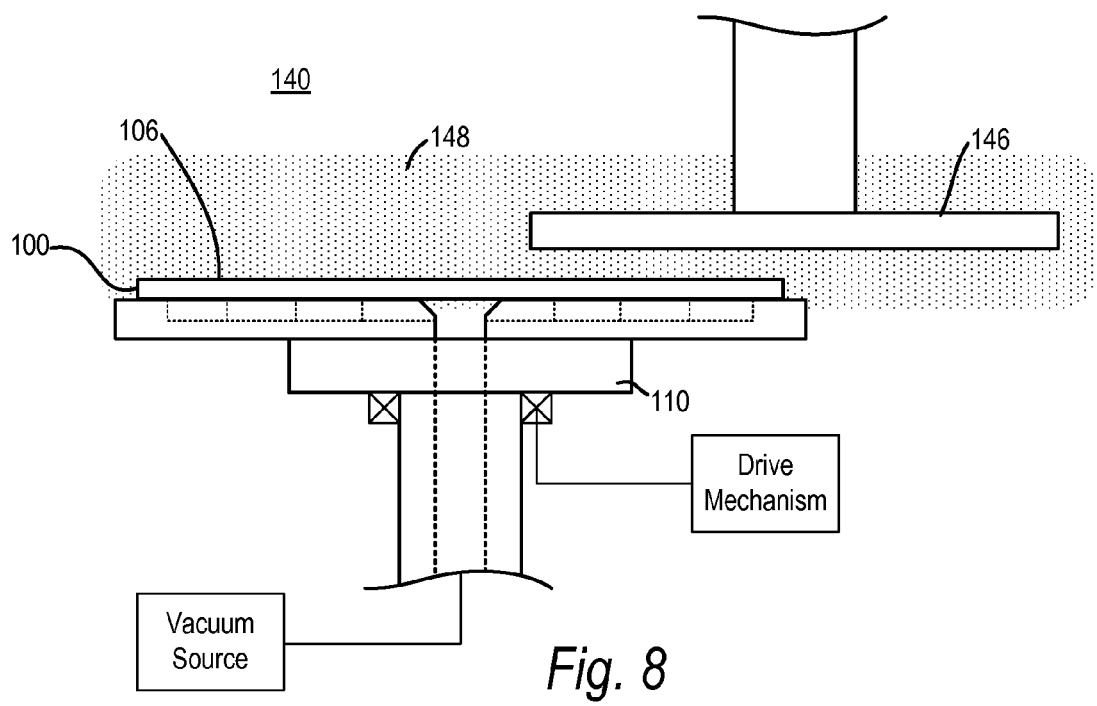
FIG. 8 is a side view of a semiconductor wafer on a chuck during a texturing process according to embodiments of the present technology.

As discussed in the Background section, impurities can migrate to the active surface of a wafer 100 where they can degrade performance and negatively impact yield. Therefore, in accordance with the present technology, after the polishing step 212, a texturing step 216 may be performed on the inactive surface 106 to provide textured sites which attract and trap impurities. A texturing process is described hereinafter with respect to a processing station 140 (FIG. 8). However, as discussed below, the texturing process may be performed in the same station as the polishing process in further embodiments. As shown in FIG. 8, the chuck 110 with wafer 100 still mounted thereon may be transferred into the station 140. A texturing wheel 146 is provided to texture the inactive surface 106 with the aid of a slurry 148, which may be introduced into the station as the chuck 110 and texturing wheel 146 rotate in contact with each other.

The texturing wheel 146 may have a texturing pad which may for example be or include a polyurethane cloth. In embodiments where the texturing step 216 is performed in the same station as the polishing step 212, the same pad may be used for both the polishing and texturing steps. Other known materials may be used as the texturing surface on texturing wheel 146.

The polishing and texturing steps 212, 216 may thin the wafer 100 from an initial thickness of 52 µm down to a final wafer thickness of 50 µm. It is understood that starting and ending thicknesses of the wafer 100 for the polishing and texturing steps 212, 216 may be larger or smaller than these values in further embodiments. In one further embodiment, the coarse backgrind process may thin the wafer from 760 µm down to 72 µm; the fine backgrind process may thin the wafer from 72 µm down to 42 µm; and the polishing and texturing steps may reduce the wafer thickness down from 42 µm to a final thickness of 40 µm. Again, other thicknesses at the start and finish of each process are contemplated.

The slurry 148 provides a texture to the inactive surface 106 when the slurry is rubbed against the inactive surface 106 by the texturing wheel 146. In embodiments, the texturing slurry may be comprised of different materials including a mixture of cerium dioxide, a surfactant and water. The mixture may be 98% to 99% water, with the remaining composition of the mixture split between the cerium dioxide and surfactant. Such a texturing slurry is made by Tokyo Seimitsu Co., Ltd. of Tokyo, Japan under the trade name EG-2. In further embodiments, the mixture may be a smaller percentage of water, or a greater percentage of water, up to for example 99.9% water.

The cerium dioxide particles may for example have a size of 0.07 µm to 1.0 µm. The size of the particles in the slurry may vary to be smaller than that or larger than that, for example up to a few microns, with the provision that the particles in the texturing slurry be larger than the particles used in the polishing slurry. Moreover, it is understood that a variety of compositions other than, or in addition to, cerium dioxide may be used in the texturing slurry, including for example silica, alumina (aluminum oxide), boron oxide, carbon crystal and diamond, silicon carbide and other materials.

Figure 9:
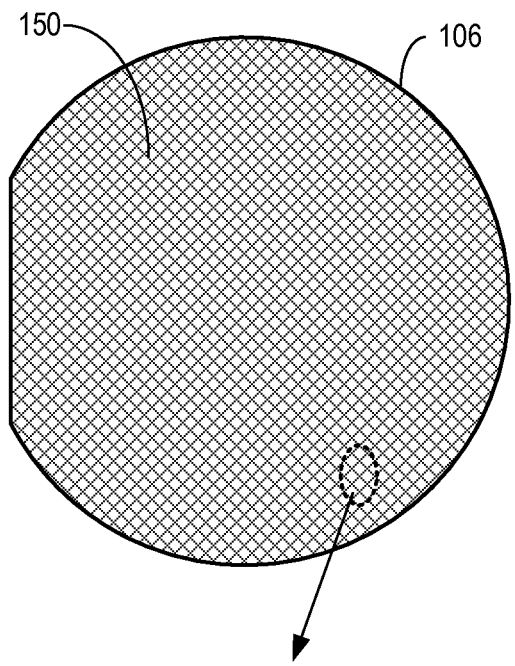
FIG. 9 is a bottom view of a semiconductor wafer after texturing according to embodiments of the present technology.
Figure 10:
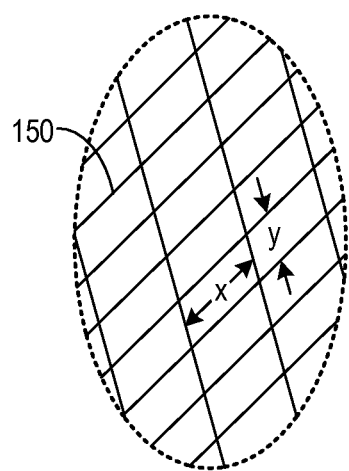
FIG. 10 is an enlarged bottom view of a semiconductor wafer after texturing according to embodiments of the present technology.

The texturing step 216 creates limited backside damage on the already mirror finished wafer. The degree of texturing provides a balance between attracting impurities and maintaining wafer strength. In embodiments, the degree of texturing is sufficient to attract impurities while keeping wafer strength sufficiently high to avoid any appreciable risk of the wafer breaking due to the texturing step 216. FIG. 9 shows an example of a texturing pattern 150 formed on inactive surface 106 in accordance with the texturing step 216. FIG. 10 shows an enlarged portion of the pattern 150. In one embodiment, the texturing creates diamond-shaped, or other quadrilateral-shaped, regions 152 having borders defined by the textured lines 154. The lines are defined by the particles of slurry 148 as both the chuck 110 and texturing wheel 146 rotate in contact with each other. The textured lines 154 may appear straight at the magnification of the view of FIG. 10, but the lines may curve across the diameter of the wafer 100 in embodiments.

In an embodiment, the distance, x, for portions of the wafer 100 may for example be 3.3 µm, while the distance, y, for portions of the wafer may for example be 1.8 µm. These distances are by way of example only and may vary in further embodiments. These distances may also vary proportionately and disproportionately across the wafer 100. In embodiments, the depth of a texturing line may for example be between 1 and 10 nanometers, though the depth may be smaller or greater than that in further embodiments, with the provision that the depth not exceed a threshold at which breaking of the wafer due to the texturing damage becomes a realistic possibility.

Most current extrinsic gettering techniques compromise the wafer/die strength of thin wafers due to stress concentration points left on the wafer backside. The current invention first provides good stress relief using CMP slurry in polishing step 212 before the wafer backside goes through a limited damage texturing step 216 providing a desired and controllable amount of damage to the backside of wafer 100. This process provides trapping of impurities on the inactive surface 106 of wafer 100, while also providing good mechanical strength on the wafer/die leading to higher yields in assembly and subsequently better product reliability.

Moreover, traditional intrinsic and extrinsic gettering processes have been performed on semiconductor wafers which are thicker than that contemplated in the present technology. One issue with wafer thicknesses below for example 100 µm is that there is not enough bulk within the interior of the wafer for intrinsic gettering techniques to be effective. Therefore, the present technology provides a novel process for extrinsic gettering of thin semiconductor die, having thicknesses for example below 100 µm, including for example 70 µm, 60 µm, 50 µm and 40 µm, and thicknesses in between these values. The wafer 100 and die 104 may be thinner than 40 µm in further embodiments.

In the steps described above, the inactive surface 106 of wafer 100 is first polished in step 212 to remove all stress concentration points, and then the inactive surface is textured a controlled amount in step 216. In further embodiments, the polishing step 212 and texturing step 216 may be combined into a single process. In this single process, the polishing slurry described above may be mixed with the texturing slurring described above, so that the polishing and texturing steps occur concurrently. As an alternative, the polishing step 212 may be performed, the wafer may be rinsed, and then, in the same station (for example station 130 or 140), the texturing step 216 may be performed.

After the texturing of the inactive side 106 of the wafer 100, the wafer may be removed from the chuck 110, and the protective tape may be removed from the active surface 102 of the wafer 100. In step 220, the die 104 on wafer 100 may be tested for functional defects. Such tests include for example wafer final test, electronic die sort and circuit probe. In step 224, each of the die 104 may be diced from the wafer 100. In order to perform the dicing operation, the wafer may be mounted on a dicing tape attached to a precision X-Y translating table (not shown). The cuts may then be made by any of a variety of cutting methods, including by a saw, laser, water jet or laser microjet that incorporates a laser into a thin waterjet.

Figure 11:
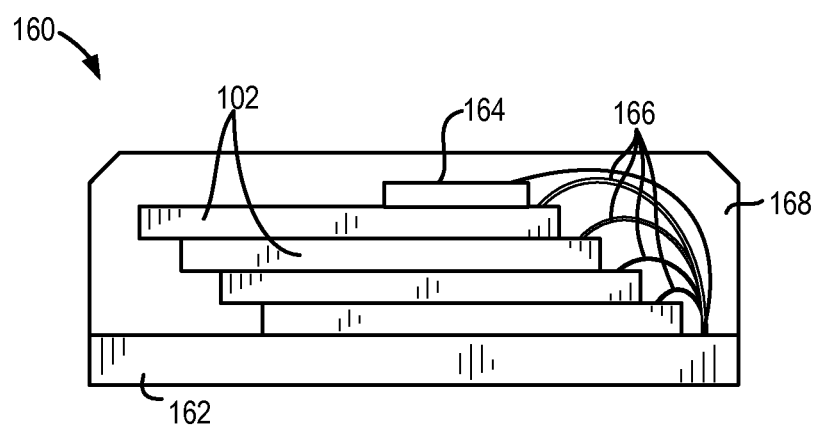
FIG. 11 is a side view of a semiconductor package fabricated from die formed according to embodiments of the present technology.

The die 104, formed and diced from wafer 100 as described above, may for example be non-volatile memory die, such as for example NAND flash memory die. However, the die 104 formed as described above can be other types of semiconductor die in further embodiments, such as for example, NOR, DRAM, various other memory die and various controller die. Referring now to the side view of FIG. 11, where die 104 are memory die, they may be formed into a semiconductor package 160 by stacking the die 104 on a substrate 162 after dicing, together with a controller die 164. The die stack may then be electrically coupled to the substrate for example by wire bonds 166. In further embodiments, one or more die 104 may be electrically coupled to the substrate 162 via flip-chip technology. The embodiment of FIG. 11 shows four semiconductor die 104, though there may be more or less die in the package 160 in further embodiments.

After electrical coupling, the die stack may be encased within the molding compound 168. The substrate 162 may initially be included in a panel of substrates to allow batch processing of the packages 160. After encapsulation, the individual packages 160 may be singulated to form the finished semiconductor packages. In some embodiments, the finished package 160 may optionally be enclosed within a lid. The package 160 may be used in a plurality of standard memory cards, including without limitation a CompactFlash card, a SmartMedia card, a Memory Stick, a Secure Digital card, a miniSD card, a microSD card, a USB memory card and others.

In embodiments, the present technology relates to a semiconductor wafer, including: an active surface including integrated circuits for a plurality of semiconductor die; and a textured pattern on a polished surface of the semiconductor wafer, the polished surface being opposite the active surface, the textured pattern preventing impurities from reaching the active surface.

In further embodiments, the present technology relates to a semiconductor wafer, including: an active surface including integrated circuits for a plurality of semiconductor die; an inactive surface opposite the active surface; and a textured pattern in the inactive surface of the semiconductor wafer, the textured pattern including a quadrilateral having a first pair of sides with a length of 3.3 µm and a second pair of sides extending between the first pair of sides, the second pair of sides having a length of 1.8 µm.

In still further embodiments, the present technology relates to a semiconductor wafer, including: an active surface including integrated circuits for a plurality of semiconductor die; and a textured pattern on an inactive surface of the semiconductor wafer free of stress concentration areas except for the textured pattern, the inactive surface being opposite the active surface and a distance being defined between the active and inactive surfaces of between 40 µm and 80 µm, the textured pattern preventing impurities from reaching the active surface, wherein the textured pattern includes a plurality of lines crossing each other in the inactive surface of the semiconductor wafer.

In another embodiment, the present technology relates to a semiconductor die, including: an active surface including an integrated circuit; and a polished surface opposite the active surface, the polished surface including a textured pattern, the textured pattern preventing impurities from reaching the active surface.

In further embodiments, the present technology relates to a semiconductor die, including: an active surface including an integrated circuit; an inactive surface opposite the active surface; and a textured pattern in the inactive surface of the semiconductor die, the textured pattern including a quadrilateral having a first pair of sides with a length of 3.3 µm and a second pair of sides extending between the first pair of sides, the second pair of sides having a length of 1.8 µm.

In another embodiment, the present technology relates to a semiconductor die, including: an active surface including an integrated circuit; and a textured pattern on an inactive surface of the semiconductor die, the inactive surface free of stress concentration areas except for the textured pattern, the inactive surface being opposite the active surface and a distance being defined between the active and inactive surfaces of less than 120 µm, the textured pattern preventing impurities from reaching the active surface, wherein the textured pattern includes a plurality of lines crossing each other in the inactive surface of the semiconductor wafer.

In a still further embodiment, the present technology relates to a semiconductor package, including: a substrate; and one or more semiconductor die. A semiconductor die of the one or more semiconductor die includes: an active surface including an integrated circuit; and a polished surface opposite the active surface, the polished surface including a textured pattern, the textured pattern preventing impurities from reaching the active surface.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A semiconductor wafer, comprising:
an active surface including integrated circuits in a plurality of semiconductor die; and
a second surface opposite the active surface, the second surface including a textured pattern comprising a plurality of intersecting lines, and a plurality of areas bounded by the plurality of intersecting lines of the textured pattern, the plurality of areas not including a textured pattern, and the plurality of areas having a more polished, planar surface than the intersecting lines of the textured pattern, the textured pattern on the second surface preventing impurities from reaching the active surface.

2. The semiconductor wafer of claim 1, wherein the plurality of lines extend one to ten nanometers into the polished surface of the semiconductor wafer.

3. The semiconductor wafer of claim 1, wherein the plurality of semiconductor die are flash memory die.

4. The semiconductor die of claim 1, wherein the plurality of semiconductor die include at least one of a NAND, NOR, DRAM and controller semiconductor die.

5. A semiconductor die, comprising:
an active surface including an integrated circuit; and
an inactive surface opposite the active surface, the inactive surface including a plurality of intersecting textured lines, the plurality of intersecting textured lines defining a plurality of bounded areas, the bounded areas having a more polished surface than the plurality of textured lines, the textured lines preventing impurities from reaching the active surface.

6. The semiconductor die of claim 5, wherein the semiconductor die is one of a NAND, NOR, DRAM and controller semiconductor die.

7. A semiconductor package, comprising:
a substrate; and
one or more semiconductor die, a semiconductor die of the one or more semiconductor die including:
an active surface including an integrated circuit; and
an inactive surface opposite the active surface, the inactive surface including a plurality of intersecting textured lines, the plurality of intersecting textured lines defining a plurality of bounded areas, the bounded areas having a more polished surface than the plurality of textured lines, the textured lines preventing impurities from reaching the active surface.

8. The semiconductor package of claim 7, wherein the semiconductor die is one of a NAND, NOR, DRAM and controller semiconductor die.

9. The semiconductor package of claim 8, further comprising a controller die.

10. The semiconductor package of claim 9, further comprising molding compound for encapsulating the one or more semiconductor die and the controller die.

11. The semiconductor package of claim 7, wherein the substrate is one of a printed circuit board, leadframe and TAB tape.

* * * * *